(12) United States Patent
Kizaki

(10) Patent No.: US 9,910,299 B2
(45) Date of Patent: Mar. 6, 2018

(54) CRYSTAL BODY, OPTICAL DEVICE HAVING THE SAME, AND METHOD OF MANUFACTURING CRYSTAL BODY

(71) Applicant: FUJIKURA, LTD., Tokyo (JP)

(72) Inventor: Takeshi Kizaki, Tokyo (JP)

(73) Assignee: FUJIKURA, LTD., Tokyo (JP)

(*) Notice: Subject to any disclaimer, the term of this patent is extended or adjusted under 35 U.S.C. 154(b) by 101 days.

(21) Appl. No.: 14/780,588

(22) PCT Filed: Oct. 23, 2014

(86) PCT No.: PCT/JP2014/078164
§ 371 (c)(1),
(2) Date: Sep. 28, 2015

(87) PCT Pub. No.: WO2015/060372
PCT Pub. Date: Apr. 30, 2015

(65) Prior Publication Data
US 2016/0048039 A1    Feb. 18, 2016

(30) Foreign Application Priority Data

Oct. 23, 2013  (JP) ................... 2013-220017

(51) Int. Cl.
*G02B 1/02* (2006.01)
*G02F 1/09* (2006.01)
(Continued)

(52) U.S. Cl.
CPC ............ *G02F 1/0036* (2013.01); *C30B 15/00* (2013.01); *C30B 29/28* (2013.01); *C30B 29/34* (2013.01);
(Continued)

(58) Field of Classification Search
None
See application file for complete search history.

(56) References Cited

U.S. PATENT DOCUMENTS

| 4,604,577 A | 8/1986 | Matsumura et al. |
| 5,277,845 A * | 1/1994 | Ryuo ................... C01F 17/0012 252/584 |

(Continued)

FOREIGN PATENT DOCUMENTS

| CN | 1815302 A | 8/2006 |
| CN | 102959139 A | 3/2013 |

(Continued)

OTHER PUBLICATIONS

Grishin A. M. et al., "Low field driven latching-type $Bi_3Fe_5O_{12}/Gd_3Ga_5O_{12}$ magneto-optical display", Applied Physics Letters, Jun. 12, 2006, vol. 88, No. 24, pp. 242501-1-212504-3 (total 3 pages).

(Continued)

*Primary Examiner* — Derek S Chapel
(74) *Attorney, Agent, or Firm* — Sughrue Mion, PLLC

(57) ABSTRACT

The present invention is a crystal body configured with a crystal and having a pair of light passing surfaces which face each other and pass light and at least one side surface which connects the pair of the light passing surfaces. In the crystal body according to the present invention, a ratio B/A of a dislocation density A (number/cm²) in the light passing surfaces and a dislocation density B (number/cm²) in the side surface satisfies the following general formula.

$$1 \leq (B/A) \leq 3600 \qquad (1)$$

10 Claims, 17 Drawing Sheets

(51) Int. Cl.
*G02F 1/00* (2006.01)
*C30B 29/28* (2006.01)
*C30B 33/00* (2006.01)
*G02B 27/28* (2006.01)
*C30B 15/00* (2006.01)
*C30B 29/34* (2006.01)
*G02F 1/01* (2006.01)

(52) U.S. Cl.
CPC ............... *C30B 33/00* (2013.01); *G02B 1/02* (2013.01); *G02B 27/286* (2013.01); *G02F 1/0136* (2013.01); *G02F 1/09* (2013.01)

(56) References Cited

U.S. PATENT DOCUMENTS

| | | | |
|---|---|---|---|
| 5,344,720 A * | 9/1994 | Belt | C30B 33/00 427/127 |
| 2003/0128418 A1* | 7/2003 | Sugawara | G02F 1/0036 359/280 |
| 2003/0174397 A1 | 9/2003 | Sugawara et al. | |
| 2003/0177975 A1 | 9/2003 | Ikesue et al. | |
| 2007/0187645 A1* | 8/2007 | Lyons | C09K 11/7774 252/301.4 R |

FOREIGN PATENT DOCUMENTS

| | | |
|---|---|---|
| EP | 0 811 851 A2 | 12/1997 |
| EP | 2 500 763 A1 | 9/2012 |
| EP | 2599899 A1 | 6/2013 |
| JP | 2003-114332 A | 4/2003 |
| JP | 2003-238295 A | 8/2003 |
| JP | 2012-208490 A | 10/2012 |

OTHER PUBLICATIONS

Communication dated Mar. 22, 2017 from the European Patent Office in counterpart Application No. 14855377.9.
International Search Report for PCT/JP2014/078164 dated Jan. 27, 2015.
Communication dated Jan. 13, 2017 from the Russian Patent Office in counterpart Application No. 2015148749/05.
Communication dated Mar. 2, 2017 issued by the State Intellectual Property Office of People's Republic of China in counterpart application No. 201480030344.5.
Deng Peizhen, Qiao Jingwen and Qian Zhenying, "Influence of dislocation in YAG:Nd crystal on laser characteristics", ACTA Optica Sinca, vol. 2, No. 3, May 1982, pp. 259-268 (11 pages total).

* cited by examiner

CRYSTAL BODY, OPTICAL DEVICE HAVING THE SAME, AND METHOD OF MANUFACTURING CRYSTAL BODY

CROSS REFERENCE TO RELATED APPLICATIONS

This application is a National Stage of International Application No. PCT/JP2014/078164 filed Oct. 23, 2014, claiming priority based on Japanese Patent Application No. 2013-220017 filed Oct. 23, 2013, the contents of all of which are incorporated herein by reference in their entirety.

TECHNICAL FIELD

The present invention relates to a crystal body, an optical device having the same, and a method of manufacturing the crystal body.

BACKGROUND ART

In optical devices such as a Faraday rotator, a polarizer, a wavelength conversion element, a laser crystal, a lens, a wavelength plate, a beam splitter, an electro-optic element, and an acousto-optic device, a crystal body configured with a crystal is used. Such a crystal body generally has a pair of light passing surfaces which face each other and pass light and at least one side surface which connects the pair of the light passing surfaces.

For example, Patent Document 1 listed below discloses that such a crystal body is used as a Faraday rotator.

CITATION LIST

Patent Document

Patent Document 1: JP 2012-208490 A

SUMMARY OF THE INVENTION

Problem to be Solved by the Invention

However, it cannot be said that the crystal body disclosed in the above-described Patent Document 1 is always satisfactory in terms of an extinction ratio, and thus, there is still a room for improvement.

The invention has been made in consideration of the above situation, and an object thereof is to provide a crystal body capable of realizing a good extinction ratio, an optical device having the crystal body, and a method of manufacturing the crystal body.

Means for Solving Problem

The inventor of the invention studied hard to solve the aforementioned problems, and as a result, the inventor thought that due to the following reasons, a good extinction ratio was not be able to be obtained in the Faraday rotator disclosed in Patent Document 1 described above. Namely, in Patent Document 1 described above, in a case where the Faraday rotator is configured with a single crystal, the Faraday rotator is obtained by performing a polishing process on both end surfaces of a columnar sample and performing an outer periphery grinding process on an outer peripheral surface of a sample. At this time, due to the outer periphery grinding process, dislocations causing residual stress inside are introduced into an outer peripheral surface of the Faraday rotator. On the other hand, since both end surfaces of the sample is polished by the polishing process, a dislocation density is greatly reduced. Herein, the dislocations cause birefringence in the light passing surfaces of the Faraday rotator. For this reason, the inventor thought that the ratio of the dislocation density in both end surfaces of the Faraday rotator and the dislocation density in the outer peripheral surface became too large, and thus, a good extinction ratio might not be obtained. In addition, the inventor also thought that, besides the Faraday rotator, this reasoning might be correct with respect to the other optical applications where a pair of the light passing surfaces and a side surface connecting the pair of the light passing surfaces were included and a good extinction ratio was required. Therefore, the inventor has studied harder, and as a result, the inventor found out that it was important in order to solve the above-described problems that, in a crystal body, a ratio of a dislocation density in a pair of light passing surfaces and a dislocation density in a side surface connecting the pair of the light passing surfaces was in a specific range, and the inverters completed the invention.

Namely, the present invention is a crystal body configured with a crystal and having a pair of light passing surfaces which face each other and pass light and at least one side surface which connects the pair of the light passing surfaces, wherein a ratio B/A of a dislocation density A (number/cm$^2$) in the light passing surfaces and a dislocation density B (number/cm$^2$) in the side surface satisfies the following general formula.

$$1 \le (B/A) \le 3600 \tag{1}$$

According to the crystal body, it is possible to realize a good extinction ratio.

The inventor presumes the reason why the above effect is obtained by the crystal body of the invention as follows.

Namely, the ratio (B/A) of the dislocation density A (number/cm$^2$) in the light passing surfaces and the dislocation density B (number/cm$^2$) in the side surface is in the range, and thus, birefringence on the plane perpendicular to the incident direction of the light on the light passing surfaces, that is, a difference in refractive index in the two perpendicular directions is sufficiently restrained from increasing, so that linearly polarized incident light is hard to be converted into elliptically polarized light. As a result, the inventor presumes that the good extinction ratio may be realized.

In addition, the present invention is an optical device having the crystal body.

According to the optical device, it is possible to realize a good extinction ratio.

The optical device may further include: a polarizer arranged to face the one light passing surface of the pair of the light passing surfaces of the crystal body; an analyzer arranged to face the other light passing surface of the pair of the light passing surfaces of the crystal body; and a magnetic field applying unit applying a magnetic field to the crystal body.

In addition, the present invention is a method of manufacturing a crystal body configured with a crystal and having a pair of light passing surfaces which face each other and pass light and at least one side surface which connects the pair of the light passing surfaces, the method including: a preparation process of preparing a workpiece material which is configured with the crystal and is used for obtaining the crystal body; and a cutting process of obtaining the crystal body by cutting the workpiece material, wherein, in the cutting process, the crystal body is formed by removing a surface layer portion including a cut face newly appearing according to the cutting of the workpiece material, and wherein, in the cutting process, the surface layer portion includes dislocations, and the surface layer portion is removed so that a ratio B/A of a dislocation density A (number/cm$^2$) in the light passing surfaces and a dislocation density B (number/cm$^2$) in the side surface satisfies the following general formula.

$$1 \leq (B/A) \leq 3600 \quad (1)$$

More specifically, the method is a method of manufacturing a crystal body configured with a crystal and having a pair of light passing surfaces which face each other and pass light and at least one side surface which connects the pair of the light passing surfaces, the method including: a preparation process of preparing a workpiece material which is configured with the crystal and has at least one crystal portion for obtaining the crystal body, the crystal portion having the pair of the light passing surfaces; and a cutting process of forming the side surface by removing a surface layer portion including a cut face newly appearing by the cutting of the workpiece material, and obtaining the crystal body, in a process of obtaining the crystal portion by cutting the workpiece material and, after that, obtaining the crystal body, wherein, in the cutting process, the surface layer portion includes dislocations, and the surface layer portion is removed so that a ratio B/A of a dislocation density A (number/cm$^2$) in the light passing surfaces and a dislocation density B (number/cm$^2$) in the side surface satisfies the following general formula.

$$1 \leq (B/A) \leq 3600 \quad (1)$$

Herein, the crystal portion means a portion in the state that the crystal body can be obtained only by removing the surface layer portion thereof.

According to the manufacturing method, it is possible to obtain a crystal body capable of realizing a good extinction ratio.

The dislocations included in the surface layer portion in the cutting process denote dislocations caused from, for example, the cutting of the workpiece material or the grinding on the cut face.

It is preferable that, in the cutting process, the surface layer portion be removed by polishing.

In this case, in comparison with the case of removing the surface layer portion by grinding, it is possible to effectively reduce the dislocation density, so that it is possible to efficiently manufacture the crystal body.

It is preferable that the ratio (B/A) be in a range of 1 to 1000.

In this case, in comparison with a case where the ratio (B/A) deviates from the range, it is possible to realize a better extinction ratio.

It is more preferable that the ratio (B/A) be 1.

In this case, in comparison with a case where the ratio (B/A) is more than 1 or a case where the ratio B/A is less than 1, it is possible to realize a better extinction ratio.

It is preferable that the crystal be a single crystal. In this case, since there is no grain boundary in the crystal body, in comparison with a case where the crystal is a polycrystal, transmittance of the crystal body is high. In addition, in comparison with a case where the crystal is a polycrystal, the crystal body can have high laser resistance.

It is preferable that the single crystal be a terbium scandium aluminum garnet-type single crystal, a terbium scandium lutetium aluminum garnet-type single crystal, a terbium gallium garnet-type single crystal, or a terbium aluminum garnet-type single crystal.

In addition, in the invention, the dislocation density A (number/cm$^2$) in the pair of the light passing surfaces denotes an average value of the dislocation densities in the pair of the light passing surfaces. Namely, the dislocation density A (number/cm$^2$) in the pair of the light passing surfaces is defined by the following formula.

Dislocation Density $A$ (number/cm$^2$) in Pair of Light Passing Surfaces=(Dislocation Density $A$ in the One Light Passing Surface+Dislocation Density $A$ in the Other Light Passing Surface)/2

In addition, in the invention, in a case where there are plurality of the side surfaces, the dislocation density B (number/cm$^2$) in at least one side surface denotes an average value of the dislocation densities in the plurality of the side surfaces.

Effect of the Invention

According to the invention, a crystal body capable of realizing a good extinction ratio, an optical device having the crystal body, and a method of manufacturing the crystal body are provided.

MODE(S) FOR CARRYING OUT THE INVENTION

Figure 1:
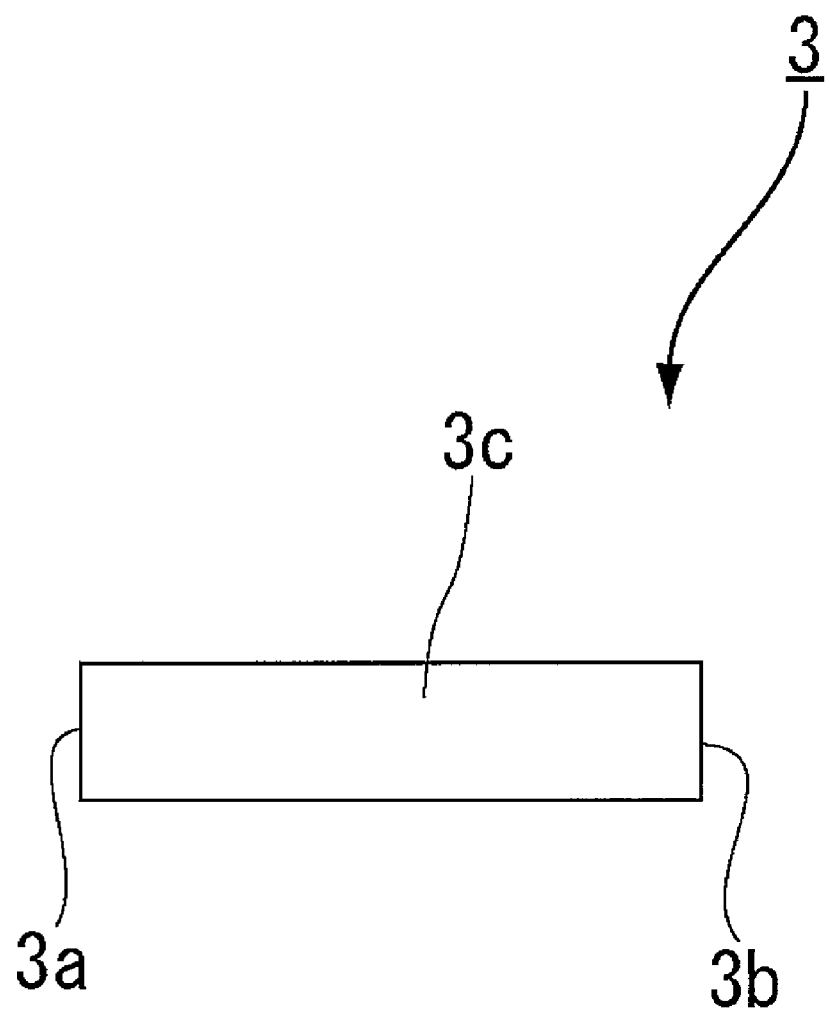
FIG. 1 is a schematic diagram illustrating an embodiment of a crystal body according to the invention.

Hereinafter, embodiments of the invention will be described in detail with reference to FIG. 1. FIG. 1 is a diagram illustrating an embodiment of a crystal body according to the invention.

As illustrated in FIG. 1, a crystal body 3 has a pair of light passing surfaces 3a and 3b which face each other and pass light and at least one side surface 3c which connects the pair of the light passing surfaces 3a and 3b. Namely, the crystal body 3 has the pair of the light passing surfaces 3a and 3b which are separated from each other and pass light and at least one side surface 3c which connects the pair of the light passing surfaces 3a and 3b. Herein, at least one side surface 3c is formed so as to connect the edge of the one light passing surface 3a of the pair of the light passing surfaces 3a and 3b and the edge of the other light passing surface 3b.

Furthermore, a ratio B/A of a dislocation density A (number/cm$^2$) in the light passing surfaces 3a and 3b and a dislocation density B (number/cm$^2$) in the side surface 3c satisfies the following general formula.

$$1 \leq (B/A) \leq 3600 \quad (1)$$

According to the crystal body 3, it is possible to realize a good extinction ratio.

Herein, the crystal body 3 will be described in detail.

Any kind of single crystal which rotates a polarization plane when a magnetic field is applied in a direction perpendicular to the light passing surfaces 3a and 3b can be used as the crystal constituting the crystal body 3. Examples of the crystal include, for example, a garnet-type single crystal such as a terbium scandium aluminum garnet-type single crystal (TSAG), a terbium scandium lutetium aluminum garnet-type single crystal (TSLAG), a terbium gallium garnet-type single crystal (TGG), and a terbium aluminum garnet (TAG), or a single crystal such as terbium oxide. However, in a case where the crystal body is used for applications where characteristics do not depend on crystalline orientation, for example, a Faraday rotator or a laser crystal, the crystal body 3 may be configured with a polycrystal. However, it is preferable that the crystal be a single crystal. In this case, since there is no grain boundary in the crystal body 3, a transmittance of the crystal body 3 becomes higher in comparison with a case where the crystal is a polycrystal. In addition, the crystal body 3 can have a higher laser resistance in comparison with a case where the crystal is a polycrystal.

The above-described ratio (B/A) is preferably in a range of 1 to 1000, more preferably in a range of 1 to 790, and particularly in a range of 1 to 100. In this case, it is possible to realize a better extinction ratio in comparison with a case where the ratio (B/A) deviates from the aforementioned ranges.

Among the aforementioned range, the ratio (B/A) is particularly preferably 1. In this case, it is possible to realize a better extinction ratio in comparison with a case where the ratio (B/A) is higher than 1 or a case where the ratio (B/A) is lower than 1.

The dislocation density in the light passing surfaces 3a and 3b is not particularly limited, but the dislocation density is preferably in a range of 1 to $1 \times 10^4$ number/cm$^2$, more preferably in a range of 1 to $5.8 \times 10^3$ number/cm$^2$, and particularly preferably in a range of 1 to $1 \times 10^3$ number/cm$^2$.

The shape of the crystal body 3 may be quadrangular cylindrical shape, circular cylindrical shape, or triangular cylindrical shape, but not particularly limited. In addition, in a case where the crystal body 3 is, for example, quadrangle columnar, the number of side surfaces 3c is four, and in a case where the crystal body 3 has a circular cylindrical shape, the number of side surfaces 3c is one.

Figure 2:
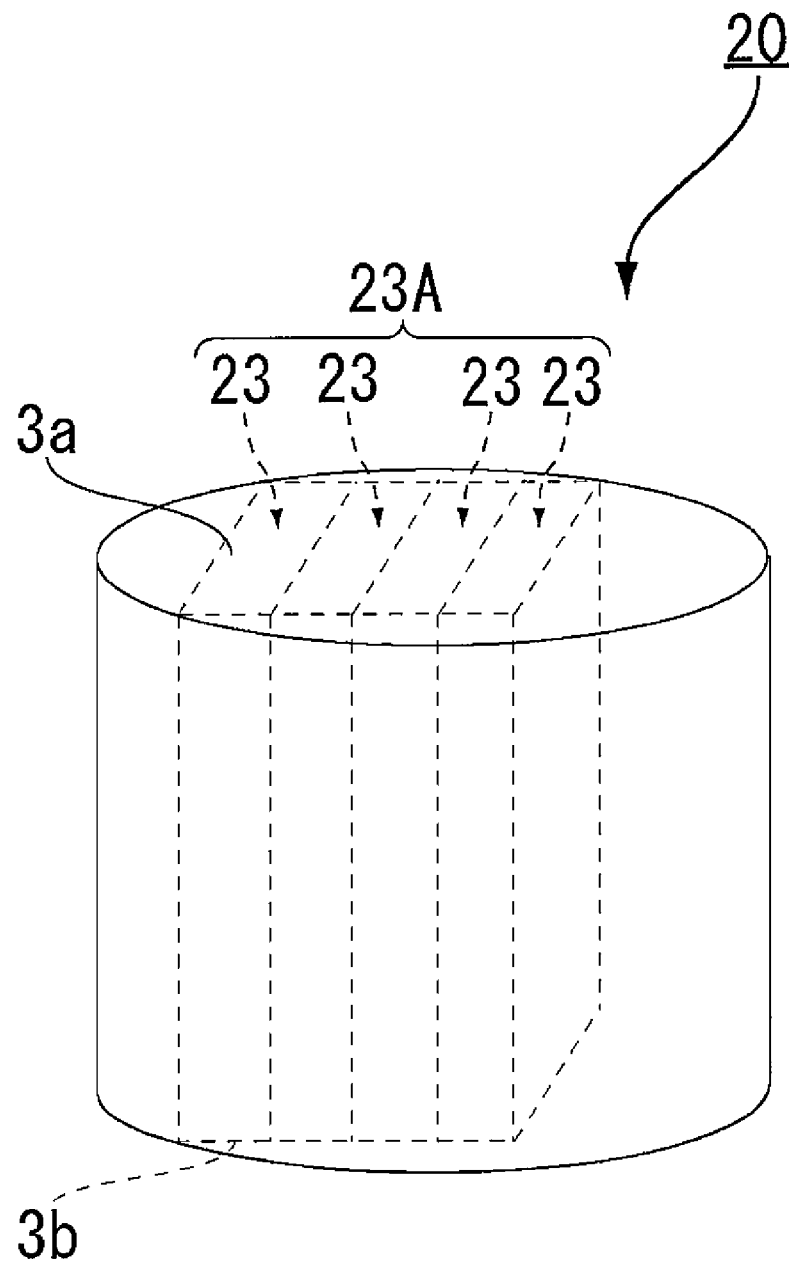
FIG. 2 is a perspective diagram illustrating an example of a workpiece material used for manufacturing the crystal body of FIG. 1.
Figure 3:
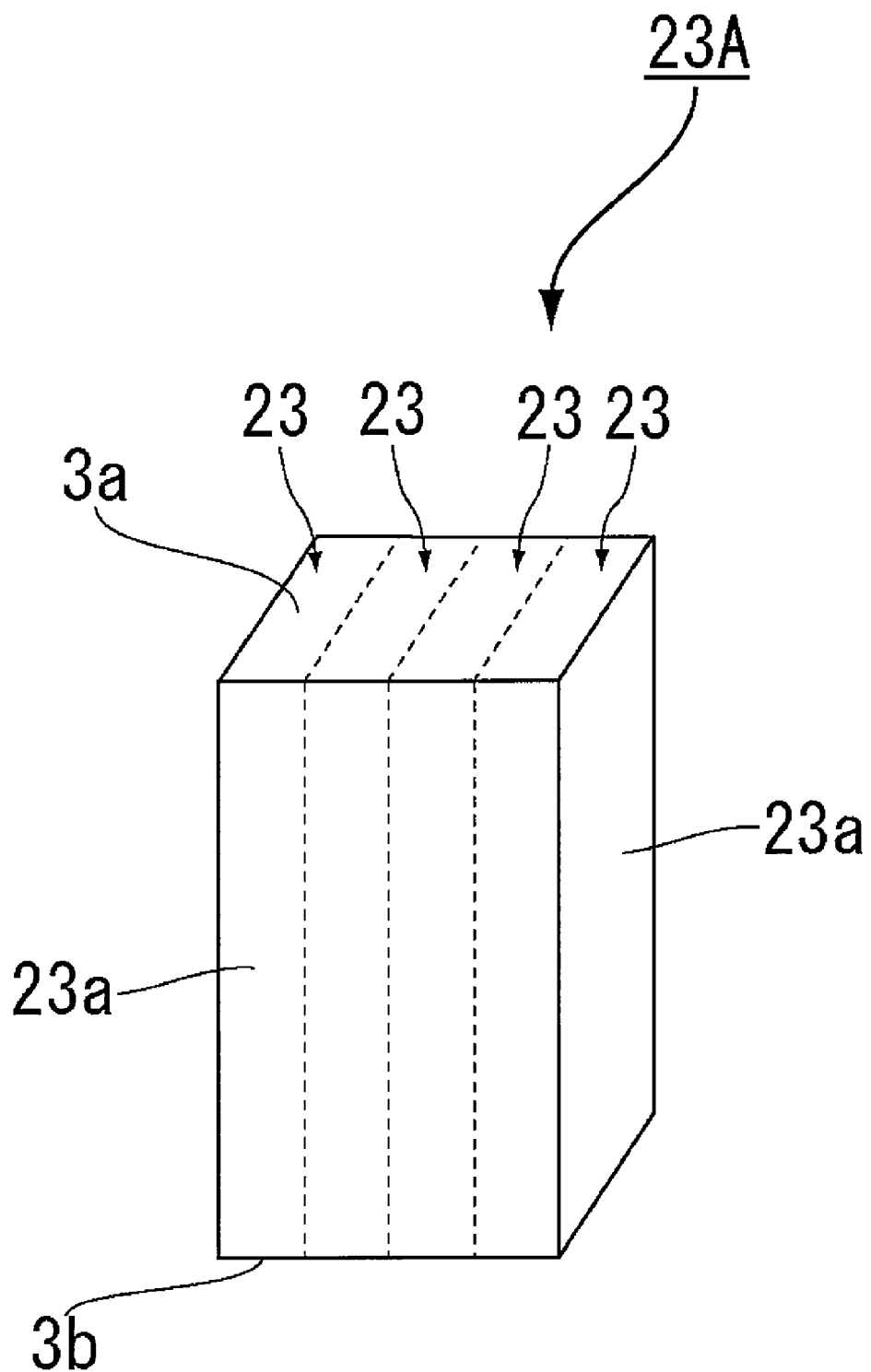
FIG. 3 is a perspective diagram illustrating a crystal processed body cut from the workpiece material of FIG. 2.
Figure 4:
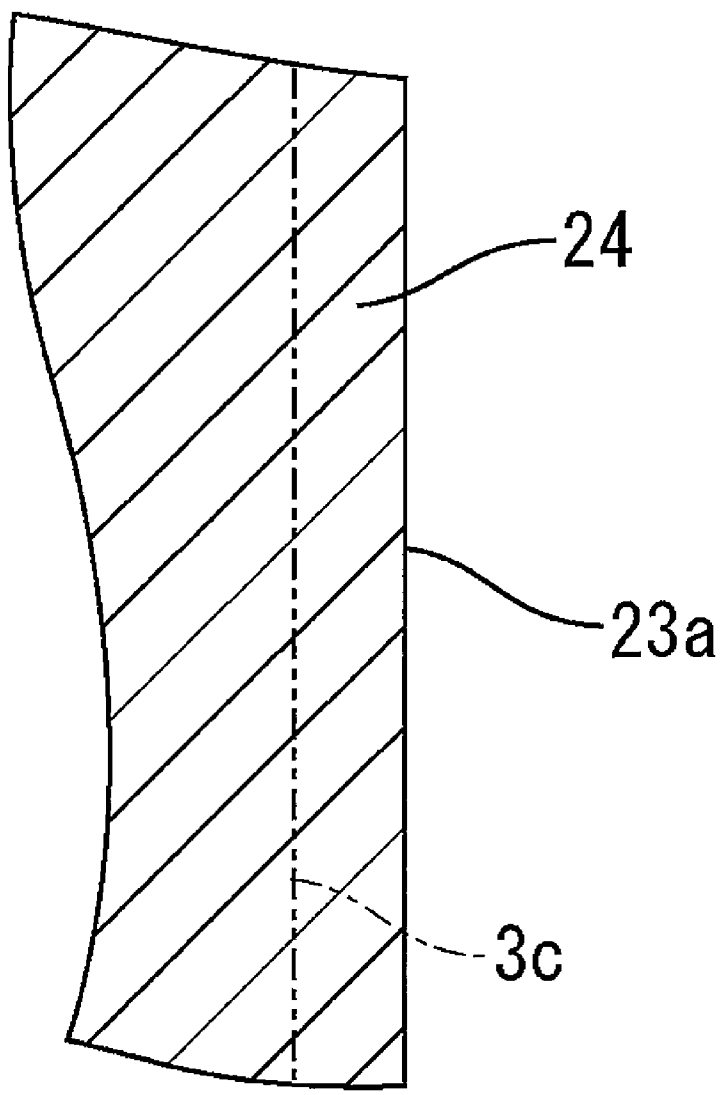
FIG. 4 is a partial cross-sectional diagram illustrating the crystal processed body of FIG. 3.
Figure 5:
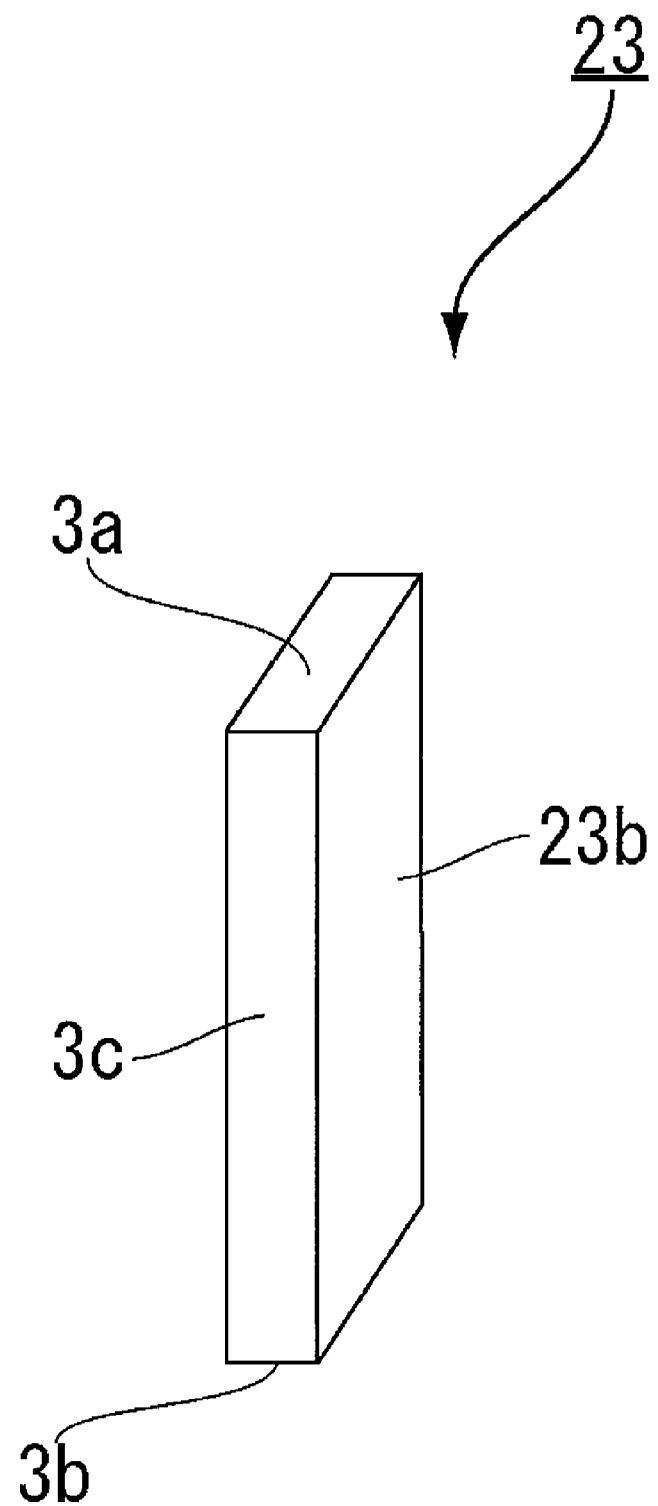
FIG. 5 is a perspective diagram illustrating a crystal portion obtained by dividing the crystal processed body of FIG. 3.
Figure 6:
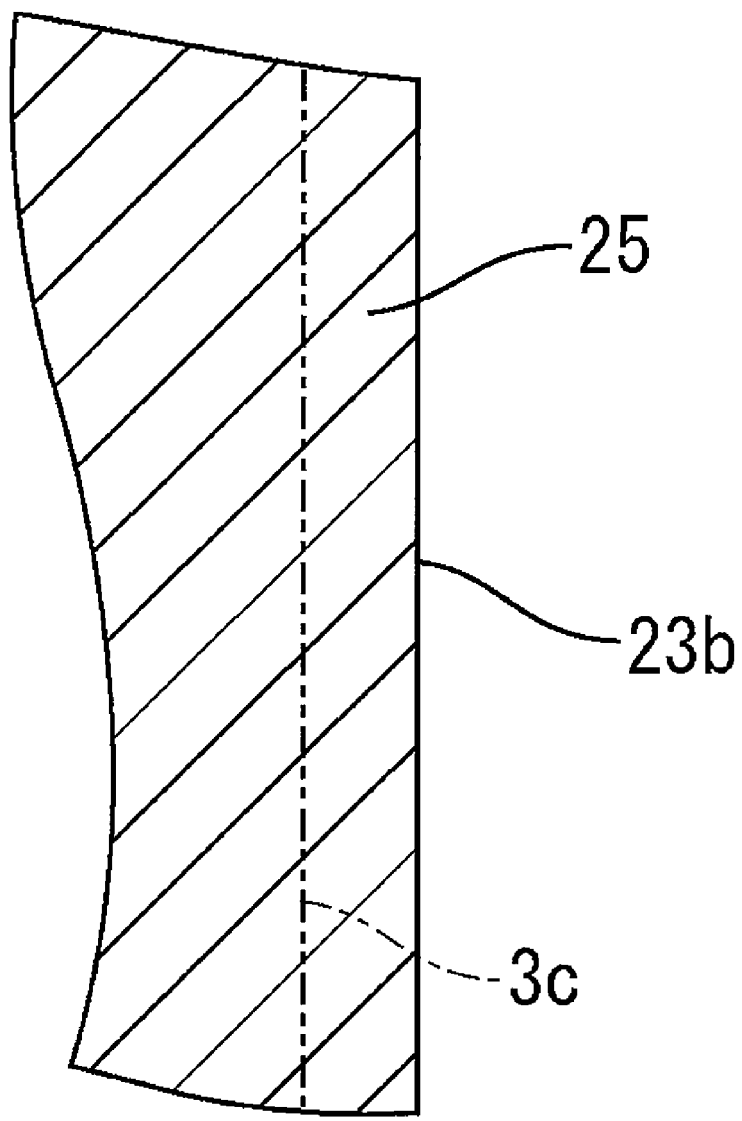
FIG. 6 is a partial cross-sectional diagram illustrating the crystal portion of FIG. 5.

Next, a method of manufacturing the crystal body 3 will be described with reference to FIGS. 2 to 6. FIG. 2 is a perspective diagram illustrating an example of a workpiece material used for manufacturing the crystal body of FIG. 1, FIG. 3 is a perspective diagram illustrating a crystal processed body cut from the workpiece material of FIG. 2, FIG. 4 is a partial cross-sectional diagram illustrating the crystal processed body of FIG. 3, FIG. 5 is a perspective diagram illustrating a crystal portion obtained by dividing the crystal processed body of FIG. 3, and FIG. 6 is a partial cross-sectional diagram illustrating the crystal portion of FIG. 5.

First, as illustrated in FIG. 2, a workpiece material 20 is prepared (preparation process). The workpiece material 20 is configured with the same single crystal as that of the crystal body 3. The workpiece material 20 includes a crystal processed body 23A configured with a plurality of crystal portions 23 corresponding to the crystal body 3, that is, the crystal portions 23 for obtaining the crystal bodies 3, and each of the crystal portions 23 has the pair of the light passing surfaces 3a and 3b. Namely, the pair of the light passing surfaces 3a and 3b in the crystal portion 23 constitute a portion of a surface of the workpiece material 20.

Next, the crystal body 3 is obtained by cutting the workpiece material 20 (cutting process). More specifically, in the process of obtaining the crystal portion 23 by cutting the workpiece material 20 and, after that, obtaining the crystal body 3, the side surface 3c is formed by removing a surface layer portion including a cut face newly appearing by the cutting of the workpiece material 20, and the crystal body 3 is obtained (cutting process).

More specifically, in a case of obtaining a plurality of the crystal bodies 3 from the workpiece material 20, the cutting process is performed as follows.

Namely, first, the crystal processed body 23A configured with the plurality of the crystal portions 23 is cut out by cutting the workpiece material 20 (refer to FIG. 3).

Next, by removing a surface layer portion 24 including a cut face 23a newly appearing in the crystal processed body 23A (refer to FIG. 4), a partial side surface 3c of the entire side surface 3c of the crystal body 3 is obtained. Herein, dislocations are usually included in the surface layer portion 24, and thus, the dislocation density in the side surface 3c can be reduced by removing the surface layer portion 24. The dislocations are caused by the cutting of the workpiece material 20, the grinding of the cut face 23a, or the like. The removal of the surface layer portion 24 is performed so that the ratio B/A of the dislocation density A (number/cm$^2$) in the light passing surfaces 3a and 3b and the dislocation density B (number/cm$^2$) in the side surface 3c satisfies the following general formula.

$$1 \leq (B/A) \leq 3600 \quad (1)$$

Herein, the removal of the surface layer portion 24 is preferably performed by polishing. In this case, in comparison with the case of removing the surface layer portion 24 by grinding, it is possible to effectively reduce the dislocation density in the side surface 3c, so that it is possible to efficiently manufacture the crystal body 3. The polishing may be performed, for example, by interposing a solution of colloidal silica between a pad and the cut face 23a and shaving off the surface layer portion 24 while pressing the pad toward the cut face 23a.

At this time, the thickness of the surface layer portion 24 to be removed is not particularly limited as long as the ratio B/A satisfies Formula (1) described above. Since the dislocations usually exist within a range of 0.1 to 3 μm from the cut face 23a, the thickness of the surface layer portion 24 to be removed is preferably set to be a thickness in a range within the above range. The thickness of the to-be-removed surface layer portion 24 can be adjusted by adjusting a performing time of the polishing.

In addition, before the removal of the surface layer portion 24 of the crystal processed body 23A is performed, a grinding process may be performed on the cut face 23a. Herein, the grinding may be performed, for example, by shaving off with a grindstone of diamond.

Subsequently, the crystal processed body 23A where the surface layer portion 24 is removed is divided into the plurality of the crystal portions 23 by cutting, and the crystal body 3 is obtained from each crystal portion 23. At this time, as illustrated in FIG. 5, by removing the surface layer portion 25 including a cut face 23b newly appearing in the crystal portion 23 in the cutting process (referring to FIG. 6), the remaining side surface 3c in the entire side surface 3c is obtained. Herein, dislocations are usually included in the surface layer portion 25, and thus, the dislocation density in the side surface 3c can be reduced by removing the surface layer portion 25. The dislocations are caused by the grinding of the cut face 23b or the like. At this time, the removal of the surface layer portion 25 is also performed so that the ratio B/A of the dislocation density A (number/cm$^2$) in the light passing surfaces 3a and 3b and the dislocation density B (number/cm$^2$) in the side surface 3c satisfies the following general formula.

$$1 \leq (B/A) \leq 3600 \tag{1}$$

In addition, at this time, the removal of the surface layer portion 25 is preferably performed by polishing. In this case, in comparison with the case of removing the surface layer portion 25 by grinding, it is possible to effectively reduce the dislocation density in the side surface 3c, so that it is possible to efficiently manufacture the crystal body 3. In addition, at this time, before the removal of the surface layer portion 25 of the crystal portion 23 is performed, a grinding process may be performed on the cut face 23b. Herein, the grinding may be performed, for example, by shaving off with a grindstone of diamond.

In this manner, the crystal body 3 having the pair of the light passing surfaces 3a and 3b and the side surface 3c connecting the pair of the light passing surfaces is obtained.

Figure 7:
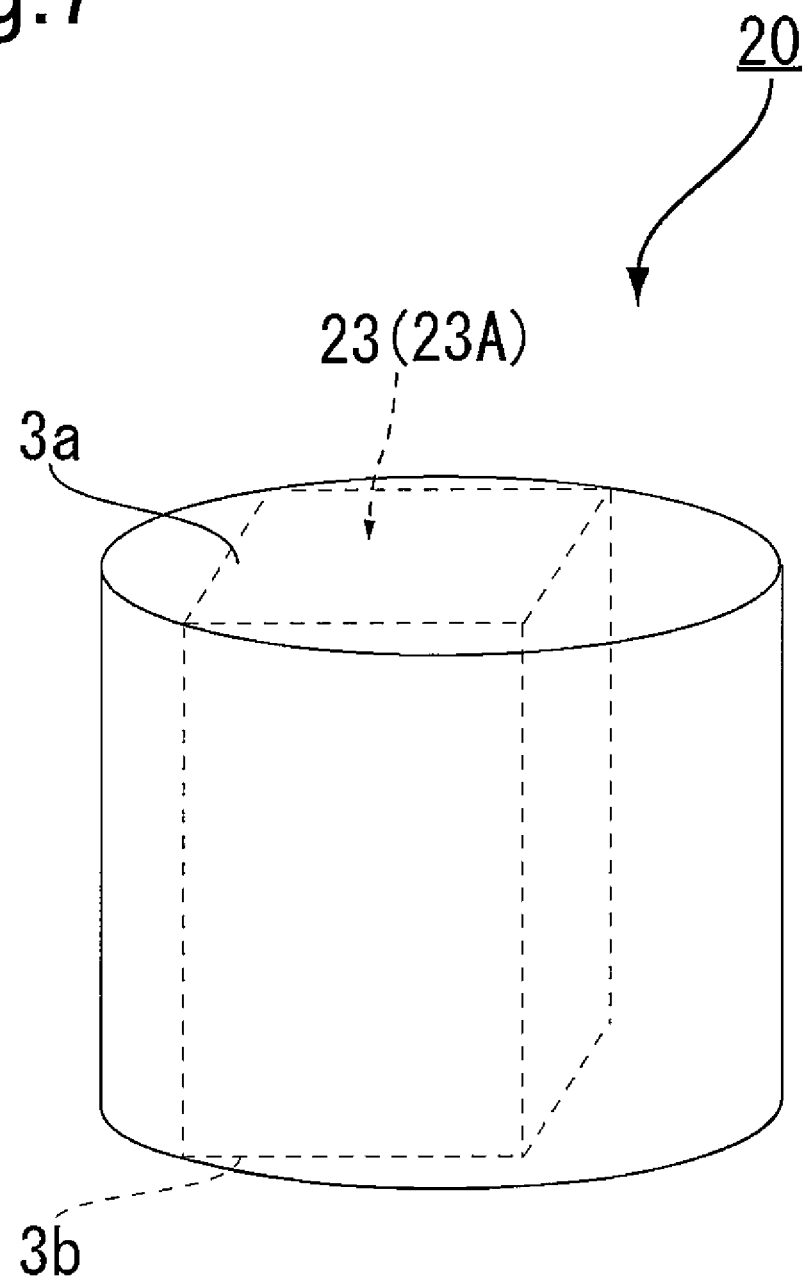
FIG. 7 is a perspective diagram illustrating another example of a workpiece material used for manufacturing the crystal body of FIG. 1.

In addition, in the case of obtaining one crystal body 3 from the workpiece material 20, the crystal body 3 can be manufactured as follows. This manufacturing method will be described with reference to FIGS. 4, 7, and 8. FIG. 7 is a perspective diagram illustrating another example of a workpiece material used for manufacturing the crystal body of FIG. 1 and FIG. 8 is a perspective diagram illustrating a crystal processed body cut from the workpiece material of FIG. 7.

First, as illustrated in FIG. 7, the workpiece material 20 is prepared (preparation process). The workpiece material 20 is configured with the same single crystal as that of the crystal body 3. The workpiece material 20 includes one crystal portion 23 corresponding to the crystal body 3, that is, the crystal portion 23 for obtaining the crystal body 3, and the crystal portion 23 has the pair of the light passing surfaces 3a and 3b. Namely, the pair of the light passing surfaces 3a and 3b in the crystal portion 23 constitutes a portion of a surface of the workpiece material 20.

Next, the crystal body 3 is obtained by cutting the workpiece material 20 (cutting process). More specifically, in the process of obtaining the crystal portion 23 by cutting the workpiece material 20 and, after that, obtaining the crystal body 3, the side surface is formed by removing a surface layer portion including a cut face newly appearing by the cutting of the workpiece material 20, and the crystal body 3 is obtained (cutting process).

Figure 8:
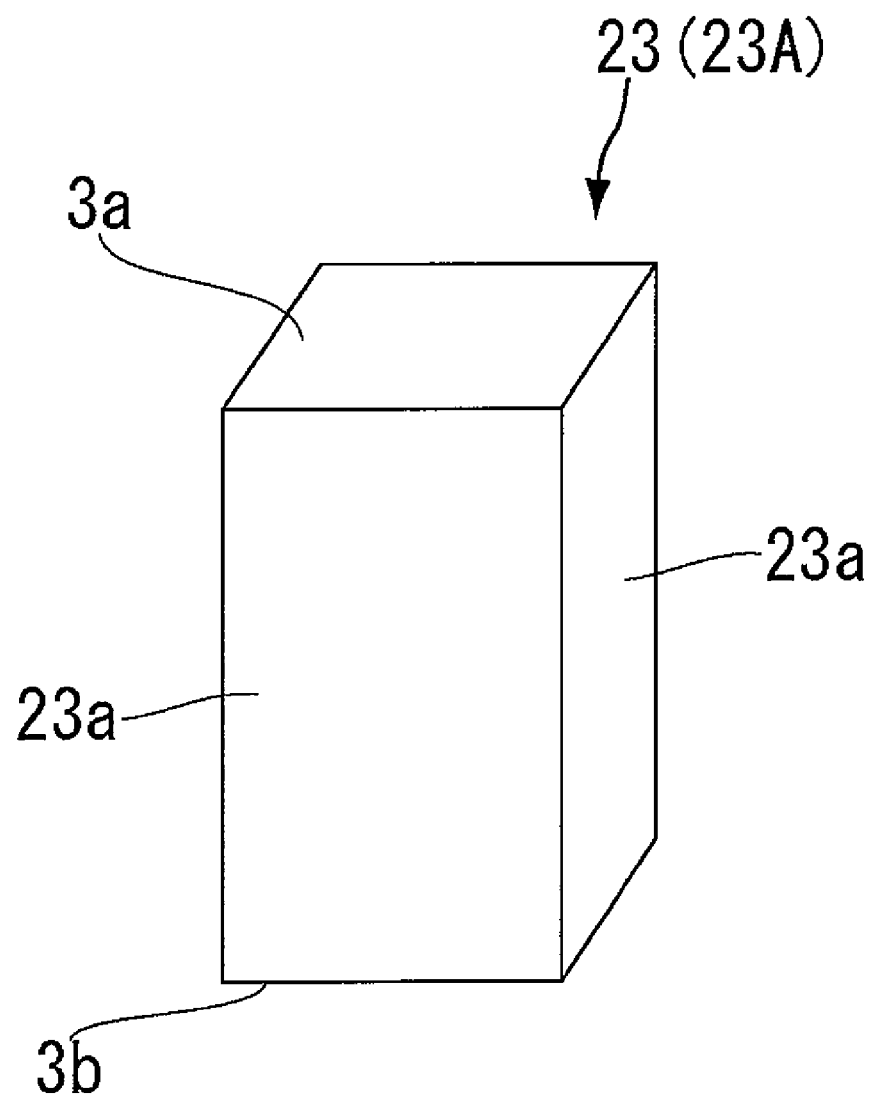
FIG. 8 is a perspective diagram illustrating a crystal processed body cut from the workpiece material of FIG. 7.

More specifically, first, as illustrated in FIG. 8, a crystal processed body 23A configured with one crystal portion 23 is cut from the workpiece material 20.

Next, as illustrated in FIG. 4, the entire side surface 3c of the crystal body 3 is obtained by removing the surface layer portion 24 including the cut face 23a newly appearing in the crystal processed body 23A.

In this manner, the crystal body 3 having the pair of the light passing surfaces 3a and 3b and the side surface 3c connecting the pair of the light passing surfaces is obtained.

At this time, the removal of the surface layer portion 24 is performed so that the ratio B/A of the dislocation density A (number/cm$^2$) in the light passing surfaces 3a and 3b and the dislocation density B (number/cm$^2$) in the side surface 3c satisfies the following general formula.

$$1 \leq (B/A) \leq 3600 \tag{1}$$

In addition, the method of removing the surface layer portion 24 and the thickness of the surface layer portion 24 to be removed are the same as those of the case of obtaining the plurality of the crystal portions 23 from the workpiece material 20. In addition, similarly to the case of obtaining the plurality of the crystal portions 23 from the workpiece material 20, before the removal of the surface layer portion 24 of the crystal processed body 23A is performed, a grinding process may be performed on the cut face 23a. At this time, the method of the grinding process is the same as that of the case of obtaining the plurality of the crystal portions 23 from the workpiece material 20.

By obtaining the crystal body 3 in this manner, it is possible to obtain the crystal body 3 capable of realizing a good extinction ratio.

Figure 9:
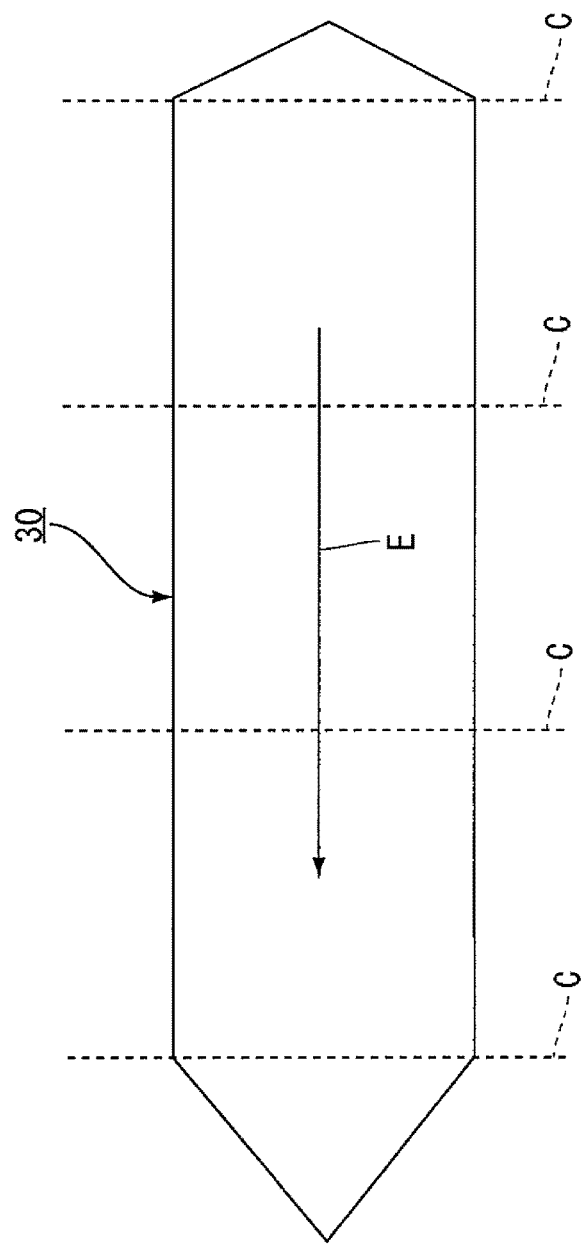
FIG. 9 is a plan diagram illustrating an example of a single crystal ingot used for manufacturing the workpiece materials of FIGS. 2 and 7.

Next, the above-described preparation process and the above-described cutting process will be described in detail with reference to FIGS. 9 and 10. FIG. 9 is a plan diagram illustrating an example of a single crystal ingot used for manufacturing the workpiece materials of FIGS. 2 and 7 and FIG. 10 is a cross-sectional diagram illustrating a round slice portion cut from the single crystal ingot of FIG. 9.

(Preparation Process)

Figure 10:
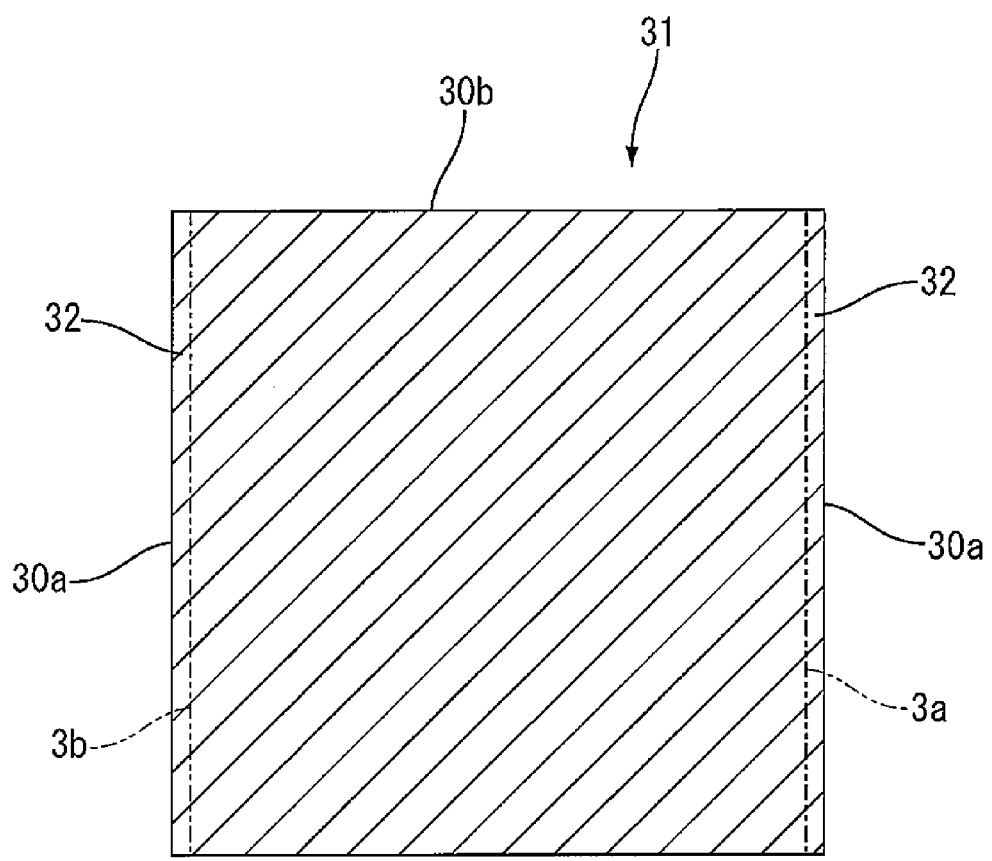
FIG. 10 is a cross-sectional diagram illustrating a round slice portion cut from the single crystal ingot of FIG. 9.

The workpiece material 20 used for the preparation process can be obtained by preparing a single crystal ingot 30 grown according to, for example, a Czochralski method as illustrated in FIG. 9, forming round slice portions 31 as illustrated in FIG. 10 by cutting the single crystal ingot 30 into round slices in a plane C perpendicular to an extending direction E, that is, a pulling direction of the single crystal ingot 30, and removing a surface layer portion 32 including a cutting surface 30a newly appearing in the round slice portion 31. At this time, the removal of the surface layer portion 32 may be performed in the same manner as described above. At this time, by removing the surface layer portion 32 in the round slice portion 31, two light passing surfaces 3a and 3b can be obtained. At this time, the removal of the surface layer portion 32 may be performed so that the dislocation density in the light passing surfaces 3a and 3b is, preferably in a range of 1 to $1 \times 10^4$ number/cm$^2$, and more preferably in a range of 1 to $1 \times 10^3$ number/cm$^2$. In addition, at this time, the removal of the surface layer portion is not performed on a surface 30b other than the cutting surface 30a in the round slice portion 31.

(Cutting Process)

In the cutting process, the removal of the surface layer portion 24 and the surface layer portion 25 is preferably performed so that the ratio (B/A) is, preferably, in a range of 1 to 1000, more preferably, in a range of 1 to 790, and particularly preferably, in a range of 1 to 100. In this case, in comparison with a case where the ratio (B/A) of the obtained crystal body 3 deviates from the ranges, it is possible to realize a better extinction ratio.

Among the ranges, the removal of the surface layer portion 24 and the surface layer portion 25 be particularly preferably performed so that the ratio (B/A) of the dislocation density A (number/cm$^2$) in the light passing surfaces 3a and 3b and the dislocation density B (number/cm$^2$) in the side surface 3c is 1.

In this case, in comparison with a case where the ratio (B/A) is more than 1 or a case where the ratio (B/A) is less than 1, it is possible to obtain the crystal body 3 capable of realizing a better extinction ratio.

Figure 11:
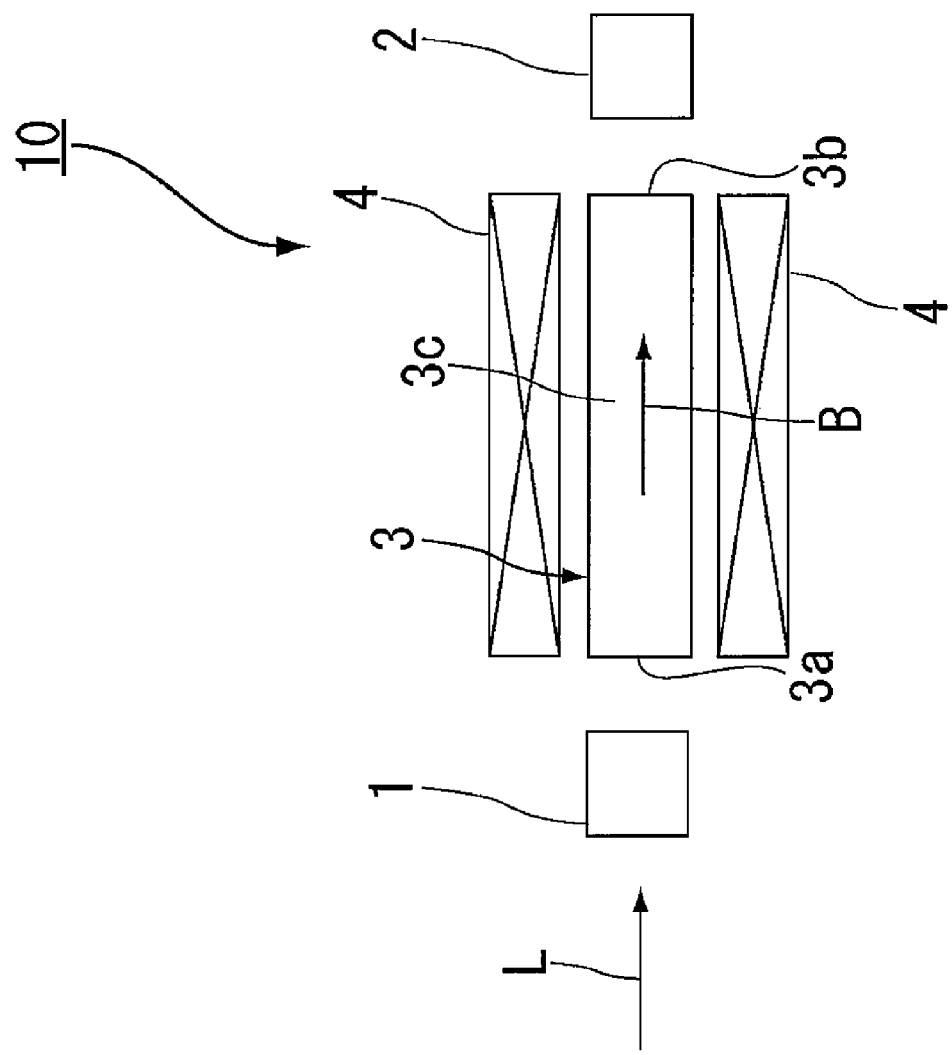
FIG. 11 is a partial cross-sectional diagram illustrating an example of an optical device according to the invention.
Figure 12:
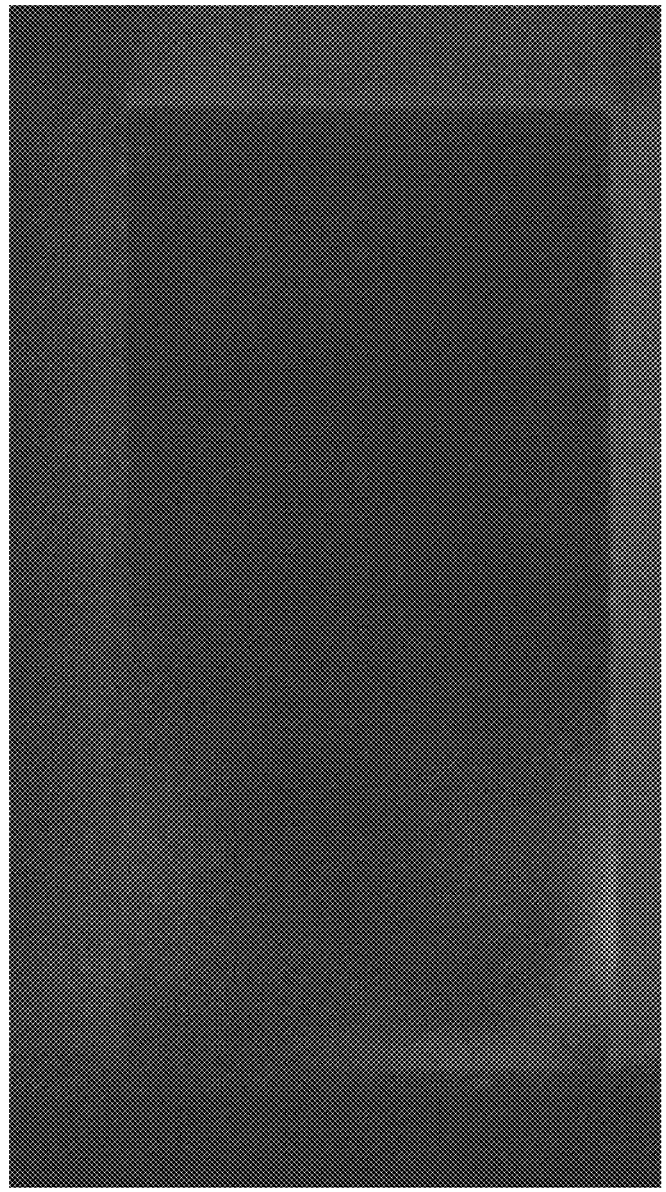
FIG. 12 is a picture illustrating a result of polarization observation with respect to a crystal body of Example 1.
Figure 13:
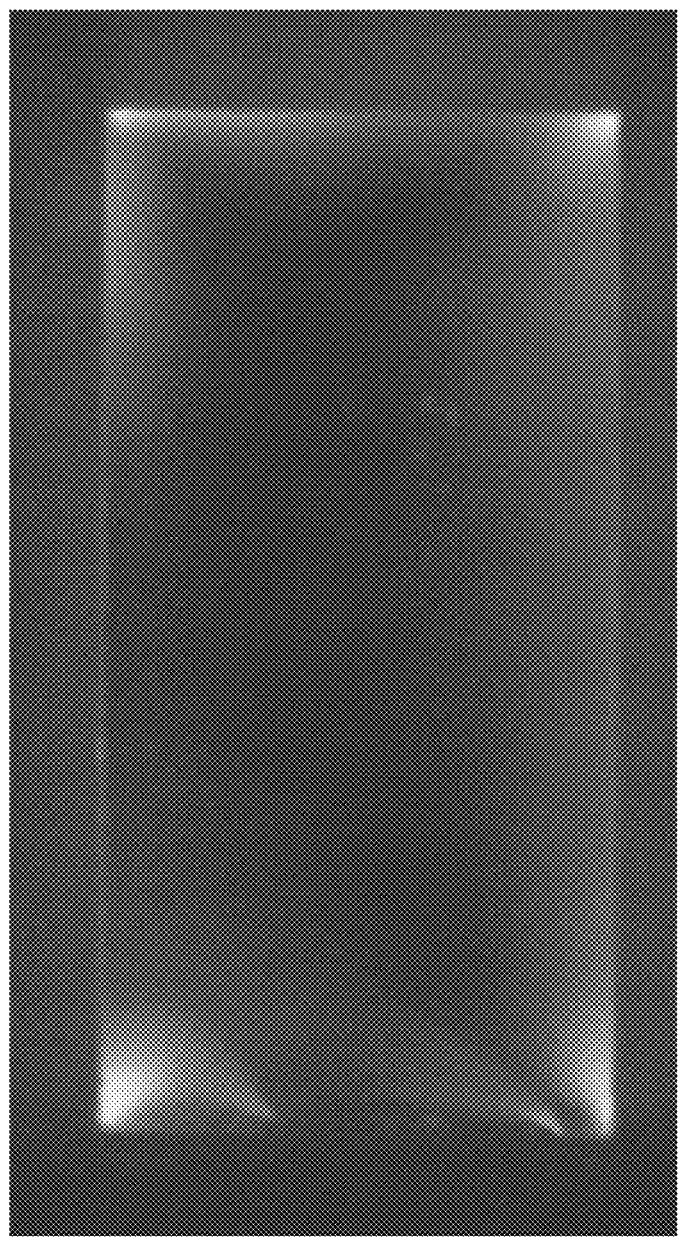
FIG. 13 is a picture illustrating a result of polarization observation with respect to a crystal body of Example 2.
Figure 14:
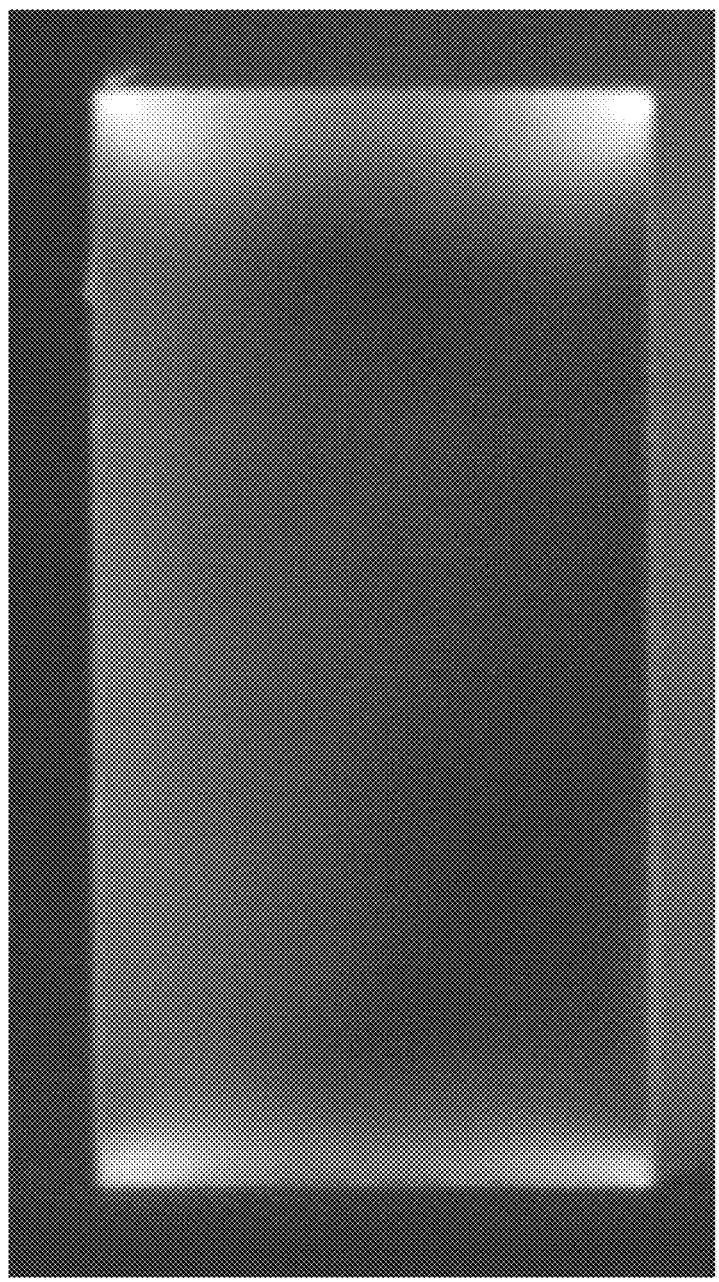
FIG. 14 is a picture illustrating a result of polarization observation with respect to a crystal body of Example 3.
Figure 15:
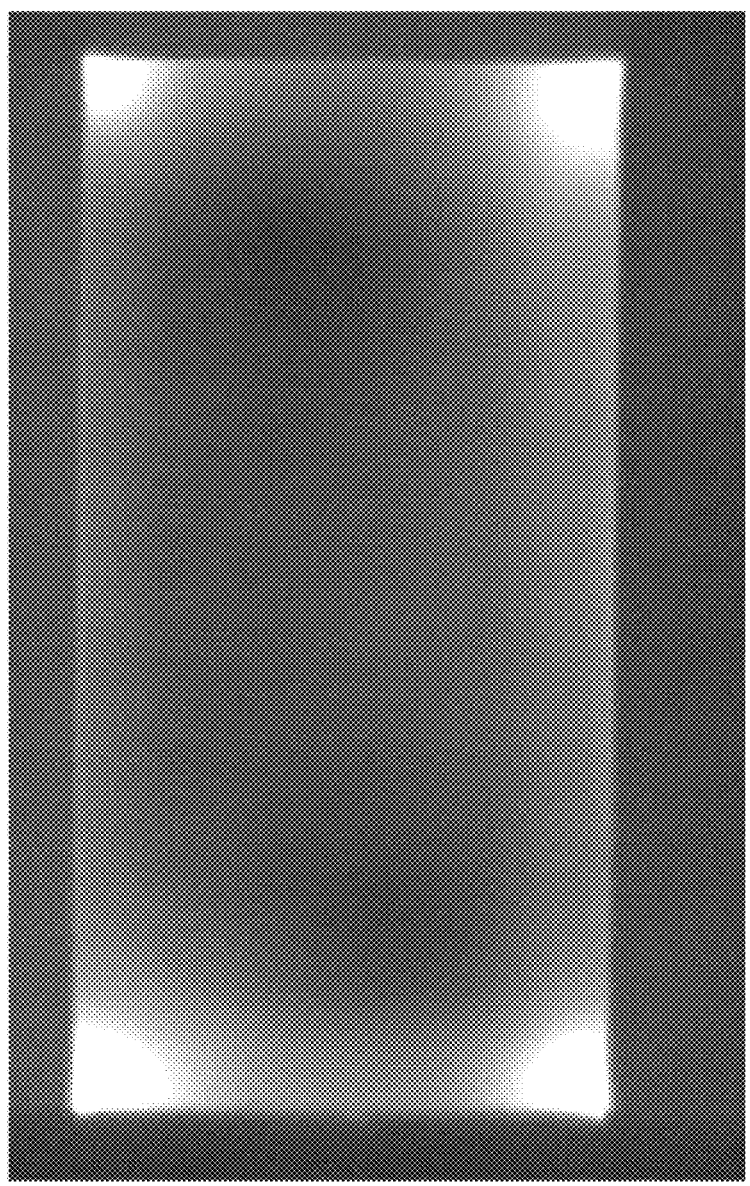
FIG. 15 is a picture illustrating a result of polarization observation with respect to a crystal body of Comparative Example 1.
Figure 16:
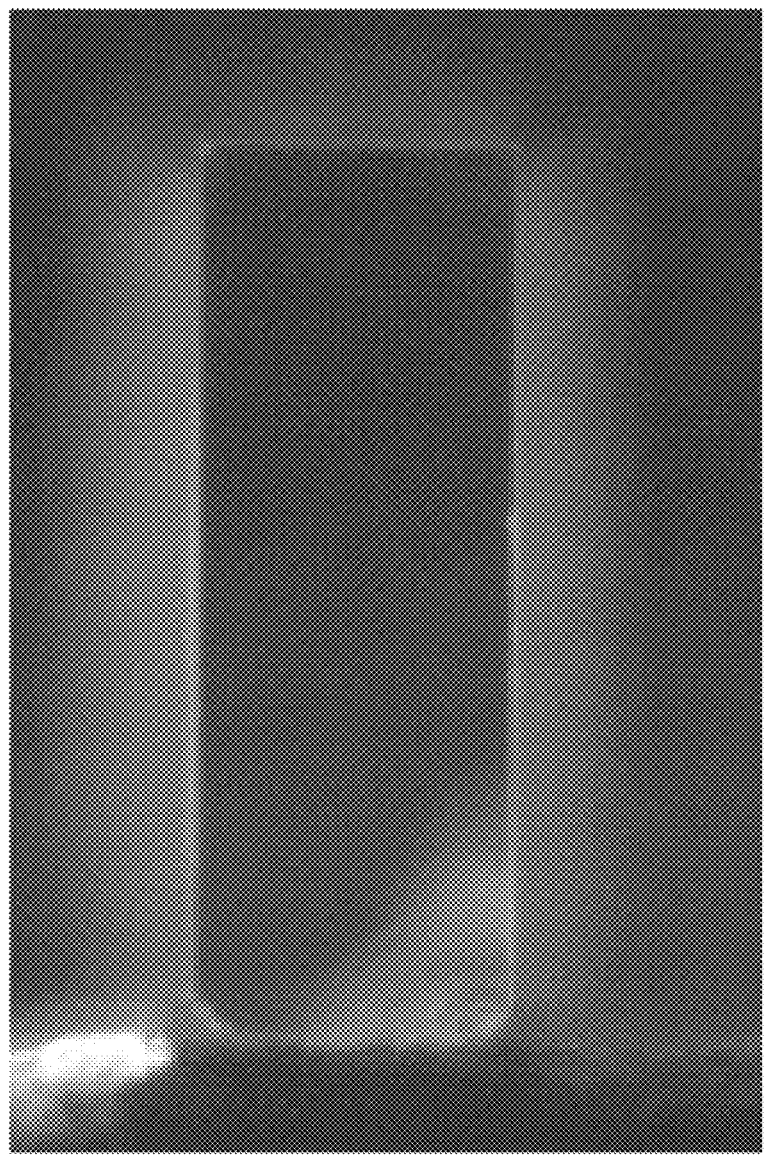
FIG. 16 is a picture illustrating a result of polarization observation with respect to a crystal body of Example 4.
Figure 17:
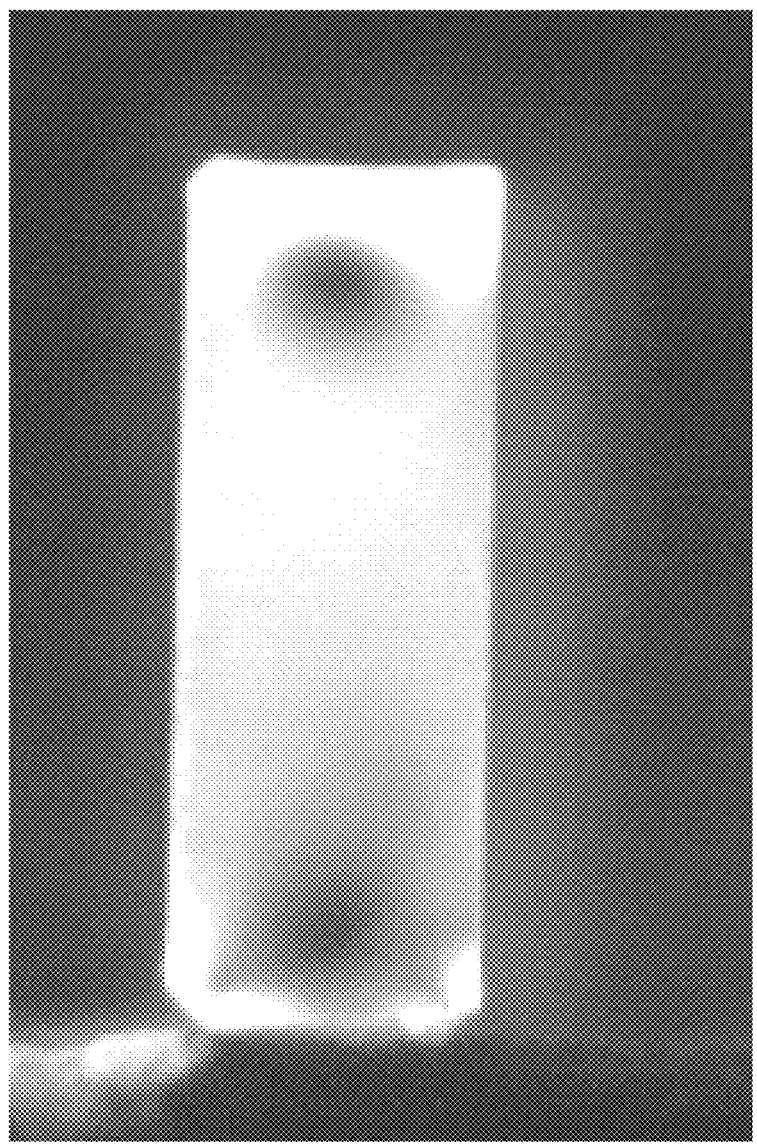
FIG. 17 is a picture illustrating a result of polarization observation with respect to a crystal body of Comparative Example 2.

Next, an example of the optical device according to the invention will be described with reference to FIG. 11. FIG. 11 is a partial cross-sectional diagram illustrating the example of the optical device according to the invention. As illustrated in FIG. 11, an optical isolator 10 as an optical device comprises the crystal body 3 as a Faraday rotator, a polarizer 1 arranged to face the light passing surface 3a of the crystal body 3, an analyzer 2 arranged to face the light passing surface 3b of the crystal body 3, and a magnetic field applying unit 4 applying a magnetic field B to the crystal body 3.

The magnetic field applying unit 4 applies the magnetic field B, for example, in the direction from the polarizer 1 toward the analyzer 2, that is, parallel to the incident direction of the light L and is configured with, for example, a magnet. In addition, the polarizer 1 and the analyzer 2 are arranged so that the optical transmission axes thereof are not parallel to each other, for example, have an angle of 90°.

The crystal body 3 rotates the polarization plane of the light L passing through the optical transmission axis of the polarizer 1 by applying the magnetic field B and passes the light through the optical transmission axis of the analyzer 2.

The light passing surfaces 3a and 3b are arranged to be perpendicular to the incident direction of the light.

According to the optical isolator 10 described above, since the crystal body 3 is used, it is possible to realize a good extinction ratio.

In addition, although the optical device 10 is configured by an optical isolator using the crystal body 3 as a Faraday rotator in FIG. 11, any crystal body 3 having a shape having a pair of light passing surfaces and a side surface connecting the pair of light passing surfaces can be applied to other applications requiring a polarizer, a wavelength conversion element, a lens, a wavelength plate, a laser crystal, a beam splitter, an electro-optic element, an acousto-optic device, and the like to show a good extinction ratio.

EXAMPLE

Herein, the content of the invention will be described in detail with reference to Examples, but the invention is not limited to Examples described below.

Example 1

First, a workpiece material was prepared as follows. First, a single crystal ingot having a diameter of 20 mm and being made of a terbium scandium lutetium aluminum garnet-type single crystal (TSLAG) was grown using a Czochralski method. Next, by cutting the single crystal ingot into round slices in a plane perpendicular to an extending direction of the single crystal ingot with an inner circumferential blade cutting machine (product name: "S-LM-E-50", manufactured by Tokyo Seimitsu Co., Ltd.), round slice portions having a diameter of 20 mm and a length of 20 mm were formed. Next, after grinding was performed on two parallel cut faces newly appearing in the round slice portion, surface layer portions including the cut faces were removed by performing polishing. At this time, the grinding was performed by shaving off with a grindstone of diamond. Specifically, the grinding was performed by using a grinding apparatus (product name: "SGM-6301", manufactured by Shuwa Industry Co., Ltd.). In addition, the polishing was performed by interposing a solution of colloidal silica between a pad (product name: "530N", manufactured by ENGIS JAPAN Corporation) and the cut face, and shaving off the cut face for 10 minutes while pressing the pad toward the cut face. Specifically, the polishing was performed by using a polishing machine (product name: "EJW-400IFN", manufactured by ENGIS JAPAN Corporation). At this time, the thickness of the removed surface layer portion was 1.6 µm. In addition, as the solution of colloidal silica, a solution made of a product name "COMPOL" (manufactured by Fujimi Incorporated) was used. With respect to the planes other than the cut face in the round slice portion, neither grinding nor polishing was performed. In this manner, the workpiece material was obtained.

Next, by cutting the workpiece material, a rectangular parallelepiped crystal processed body having dimensions of 20 mm×6 mm×18 mm and being configured with a plurality of crystal portions was cut out.

At this time, similarly to the grinding and the polishing performed on the cut faces of the round slice portion, the grinding and the polishing were also sequentially performed on the cut face newly appearing in the crystal processed body, so that the surface layer portion including the cut face was removed, and a portion of the side surface was obtained. At this time, the thickness of the surface layer portion removed by the polishing was 1.6 µm.

Subsequently, the crystal processed body was divided into six plate-like crystal portions by cutting. At this time, similarly to the grinding and the polishing performed on the cut faces of the round slice portion, the grinding and the polishing were also sequentially performed on the cut face newly appearing in the crystal portion, so that the surface layer portion including the cut face was removed, and the remaining side surface was obtained.

In this manner, the crystal body having a pair of light passing surfaces and four side surfaces connecting the pair of the light passing surfaces was obtained. At this time, the crystal body was cut, and the cross section thereof was observed by a transmission electron microscope. The dislocation density A (number/cm$^2$) in the light passing surfaces and the dislocation density B (number/cm$^2$) in the side surface 3c were calculated from the number of dislocations in the field of view observed and the area of the field of view according to the following formula.

Dislocation Density=(Number of Dislocations in Field of View Observed)/(Area (cm$^2$) of Field of View)

The value B/A was calculated from the values A and B. The result was listed in Table 1. In addition, in the observation of the cross section, with respect to the dislocations, it was determined that, if one black line was observed by the microscope, there was one dislocation.

In addition, in a case where the dislocation density was low and there was no dislocation in the field of view observed by the transmission electron microscope, the dislocation density was measured by an etch-pit method. The etch-pit method is a method of immersing the polishing plane in a phosphoric acid at 200° C., cleaning with pure water, observing with an optical microscope, and determining a recessed portion formed by etching with the phosphoric acid as a dislocation. The dislocation density was calculated from the area of the field of view and the number of dislocations.

Example 2

The crystal body was manufactured in the same manner as Example 1 except for setting the value B/A from 1 into 790 as listed in Table 1 by changing the polishing time for the cut faces newly appearing in the crystal processed body and the cut faces newly appearing in the crystal portion from 10 minutes into 3 minutes and by changing the thickness of the removed portion from 1.6 μm into 0.48 μm.

Example 3

The crystal body was manufactured in the same manner as Example 1 except for setting the value B/A from 1 into 3600 as listed in Table 1 by changing the polishing time for the cut faces newly appearing in the crystal processed body and the cut faces newly appearing in the crystal portion from 10 minutes into 1 minutes and by changing the thickness of the removed portion from 1.6 μm into 0.16 μm.

Comparative Example 1

The crystal body was manufactured in the same manner as Example 1 except for setting the value B/A from 1 into 480000 as listed in Table 1 by changing the polishing time for the cut faces newly appearing in the crystal processed body and the cut faces newly appearing in the crystal portion from 10 minutes into 0 minutes and by changing the thickness of the removed portion from 1.6 μm into 0 μm.

Example 4

The crystal body was manufactured in the same manner as Example 1 except for setting the dislocation density A in the light passing surfaces, the dislocation density B in the side surface, and the value B/A as listed in Table 2 by preparing a single crystal ingot having a diameter of 20 mm and being made of terbium gallium garnet-type single crystal (TGG) instead of preparing a single crystal ingot having a diameter of 20 mm and being made of a terbium scandium lutetium aluminum garnet-type single crystal (TSLAG) as a workpiece material, by dividing the crystal processed body into nine plate-like crystal portions instead of dividing into the six plate-like crystal portions when the crystal processed body was cut.

Comparative Example 2

The crystal body was manufactured in the same manner as Example 4 except for performing only the same grinding as the grinding performed on the cut face of the round slice portion on the cut face newly appearing in the crystal processed body, performing only the same grinding as the grinding performed on the cut face of the round slice portion on the cut face newly appearing in the crystal portion when the crystal processed body was divided into the plate-like crystal portions by cutting, and setting the dislocation density A in the light passing surfaces, the dislocation density B in the side surface, and the value B/A as listed in Table 2.

[Evaluation of Characteristics]

(Measurement of Extinction Ratio and Polarization Observation)

First, the angle between the optical transmission axis of the polarizer and the optical transmission axis of the analyzer was set to 90°. In this state, light with an intensity (P1) was made incident, and an intensity (P2) of the light emitted from the analyzer was measured. Next, the P2/P1 was calculated, and the extinction ratio (unit: dB) was calculated based on the following formula.

$$(\text{Extinction Ratio}) = |10 \times \log_{10}(P2/P1)| \qquad [\text{Mathematical Formula 1}]$$

In addition, although the extinction ratio is generally calculated as a minus value, in the specification, for the simplification, the extinction ratio is written as an absolute value. Thus, it was found that, in the state that there is nothing between the polarizer and the analyzer, the extinction ratio was 50 dB or more.

Next, each of the crystal bodies of Examples 1 to 4 and Comparative Examples 1 and 2 was arranged between the polarizer and the analyzer. At this time, the two light passing surfaces of the crystal body were arranged so as to be parallel to the polarizer and the analyzer. Next, in the state that the light passed through the crystal body, similarly to the above case, the extinction ratio (unit: dB) was calculated. The results are listed in Tables 1 and 2. In addition, in the case of using the extinction ratio in the crystal body of Comparative Example 1 as a reference, the results of the rate of increase in extinction ratio of Examples 1 to 3 are listed in Table 1; and in the case of using the extinction ratio in the crystal body of Comparative Example 2 as a reference, the result of rate of increase in extinction ratio of Example 2 is listed in Table 2. In addition, the light was incident so that the incident direction was perpendicular to the light passing surface of the crystal body.

In addition, during the measurement of the extinction ratio, the analyzer was observed. The results are illustrated in FIGS. 12 to 17. FIGS. 12 to 17 are pictures illustrating results of polarization observation with respect to the crystal bodies of Examples 1 to 3, Comparative Example 1, Example 4, and Comparative Example 2. In FIGS. 12 to 17, inside the crystal body, the position where the residual stress becomes large is seen to be bright when the position is observed from the analyzer side, and the position where the residual stress becomes small is seen to be dark when the position is observed from the analyzer side. The reason why the position where the residual stress becomes large is seen to be bright when the position is observed from the analyzer side is as follows. Namely, in a case where there is no crystal body arranged between the polarizer and the analyzer, the light passing through the polarizer does not transmit through the analyzer, and even if there is a crystal body arranged between the polarizer and the analyzer, no birefringence is generated if there is no residual stress generated inside the crystal body. For this reason, the light passing through the polarizer and transmitting through the crystal body does not transmit through the analyzer. However, even if there is a crystal body arranged between the polarizer and the analyzer, the birefringence is generated if there is the residual stress generated inside the crystal body. For this reason, the light passing through the polarizer and transmitting through the crystal body can transmit through the analyzer. For this reason, in the crystal body, the position where the residual stress becomes large is seen to be bright when the position is observed from the analyzer side.

TABLE 1

| | Dislocation Density A in Light Passing Surfaces (Number/cm$^2$) | Dislocation Density B in Side Surface (Number/cm$^2$) | B/A | Extinction Ratio | Rate of Increase in Extinction Ratio (%) (Based on Comparative Example 1) |
|---|---|---|---|---|---|
| Example 1 | $5.8 \times 10^3$ | $5.8 \times 10^3$ | 1 | 39.2 | 38 |
| Example 2 | $5.8 \times 10^3$ | $4.6 \times 10^6$ | $7.9 \times 10^2$ | 31.1 | 9 |
| Example 3 | $5.8 \times 10^3$ | $2.1 \times 10^7$ | $3.6 \times 10^3$ | 30.1 | 6 |
| Comparative Example 1 | $5.8 \times 10^3$ | $1.2 \times 10^8$ | $4.8 \times 10^5$ | 28.5 | — |

TABLE 2

| | Dislocation Density A in Light Passing Surfaces (Number/cm$^2$) | Dislocation Density B in Side Surface (Number/cm$^2$) | B/A | Extinction Ratio | Rate of Increase in Extinction Ratio (%) (Based on Comparative Example 2) |
|---|---|---|---|---|---|
| Example 4 | $4.2 \times 10^3$ | $4.2 \times 10^3$ | 1 | 45.2 | 59 |
| Comparative Example 2 | $4.2 \times 10^3$ | $2.1 \times 10^8$ | $5.0 \times 10^4$ | 28.5 | — |

It was found out from the results listed in Tables 1 and 2 that the ratio of increase in extinction ratio of each of the crystal bodies of Examples 1 to 3 is much larger than that of the crystal body of Comparative Example 1, and that the ratio of increase in extinction ratio of the crystal body of Example 4 is much larger than that of the crystal body of Comparative Example 2.

In addition, it was found out from the results illustrated in FIGS. 12 to 17 that the residual internal stress of each of the crystal bodies of Examples 1 to 3 is smaller than that of the crystal body of Comparative Example 1 and the residual internal stress of the crystal body of Example 4 is smaller than that of the crystal body of Comparative Example 2.

Thus, it was found out that the crystal body according to the present invention is capable of realizing a good extinction ratio.

EXPLANATIONS OF LETTERS OR NUMERALS

1 Polarizer
2 Analyzer
3 Crystal body
3a, 3b Light passing surface
3c Side surface
4 Magnetic field applying unit
10 Optical isolator (optical device)
20 Workpiece material
23 Crystal portion
23a, 23b Cut face
24, 25 Surface layer portion

The invention claimed is:

1. A crystal body configured with a crystal and having a pair of light passing surfaces which face each other and pass light and at least one side surface which connects the pair of the light passing surfaces,
wherein the crystal is a single crystal,
wherein the single crystal is a terbium scandium aluminum garnet-type single crystal, a terbium scandium lutetium aluminum garnet-type single crystal, a terbium gallium garnet-type single crystal, or a terbium aluminum garnet-type single crystal, and
wherein a ratio B/A of a dislocation density A (number/cm$^2$) in the light passing surfaces and a dislocation density B (number/cm$^2$) in the side surface satisfies the following general formula:

$$1 \leq (B/A) \leq 3600 \qquad (1).$$

2. The crystal body according to claim 1, wherein the ratio (B/A) is in a range of 1 to 1000.

3. The crystal body according to claim 2, wherein the ratio (B/A) is 1.

4. An optical device comprising the crystal body according to claim 1.

5. The optical device according to claim 4, further comprising:
a polarizer arranged to face the one light passing surface of the pair of the light passing surfaces of the crystal body;
an analyzer arranged to face the other light passing surface of the pair of the light passing surfaces of the crystal body; and
a magnetic field applying unit applying a magnetic field to the crystal body.

6. A method of manufacturing a crystal body configured with a crystal and having a pair of light passing surfaces which face each other and pass light and at least one side surface which connects the pair of the light passing surfaces, the method comprising:
a preparation process of preparing a workpiece material which is configured with the crystal and is used for obtaining the crystal body; and
a cutting process of obtaining the crystal body by cutting the workpiece material,
wherein, in the cutting process, the crystal body is formed by removing a surface layer portion including a cut face newly appearing by the cutting of the workpiece material,
wherein the crystal is a single crystal,
wherein the single crystal is a terbium scandium aluminum garnet-type single crystal, a terbium scandium lutetium aluminum garnet-type single crystal, a terbium gallium garnet-type single crystal, or a terbium aluminum garnet-type single crystal, and wherein, in the cutting process, the surface layer portion includes dislocations, and the surface layer portion is removed so that a ratio B/A of a dislocation density A (number/cm$^2$) in the light passing surfaces and a dislocation density B (number/cm$^2$) in the side surface satisfies the following general formula:

$$1 \leq (B/A) \leq 3600 \qquad (1).$$

7. The method of manufacturing a crystal body according to claim 6, wherein the dislocations included in the surface layer portion are dislocations caused from the cutting of the workpiece material or the grinding on the cut face.

8. The method of manufacturing a crystal body according to claim 6, wherein the ratio (B/A) is in a range of 1 to 1000.

9. The method of manufacturing a crystal body according to claim 8, wherein the ratio (B/A) is 1.

10. The method of manufacturing a crystal body according to claim 6, wherein, in the cutting process, the surface layer portion is removed by polishing.

\* \* \* \* \*